US012106925B2

(12) United States Patent
Sinclair et al.

(10) Patent No.: US 12,106,925 B2
(45) Date of Patent: Oct. 1, 2024

(54) CYCLOTRON HAVING CONTINUOUSLY VARIABLE ENERGY OUTPUT

(71) Applicant: Applied Materials, Inc., Santa Clara, CA (US)

(72) Inventors: Frank Sinclair, Hartland, ME (US); Klaus Becker, Kensington, NH (US); Joseph C. Olson, Beverly, MA (US); Tseh-Jen Hsieh, Rowley, MA (US); Morgan Patrick Dehnel, Nelson (CA); Anand Mathai George, Kerala (IN)

(73) Assignee: Applied Materials, Inc., Santa Clara, CA (US)

( * ) Notice: Subject to any disclaimer, the term of this patent is extended or adjusted under 35 U.S.C. 154(b) by 377 days.

(21) Appl. No.: 17/560,632

(22) Filed: Dec. 23, 2021

(65) Prior Publication Data
US 2023/0207247 A1    Jun. 29, 2023

(51) Int. Cl.
*H01J 27/18* (2006.01)
*H01J 27/02* (2006.01)

(52) U.S. Cl.
CPC .......... *H01J 27/028* (2013.01); *H01J 27/18* (2013.01)

(58) Field of Classification Search
CPC ...... H01J 27/18; H01J 27/028; H01J 37/3171; H01J 37/3174; H01J 37/3177; H01J 2237/0473; H05H 7/10; H05H 13/005; H05H 13/02; H05H 13/04; H05H 13/10
See application file for complete search history.

(56) References Cited

U.S. PATENT DOCUMENTS

| 7,466,085 B2 * | 12/2008 | Nutt ...................... H05H 13/00 315/501 |
| 9,644,271 B1 * | 5/2017 | Keil ................. H01J 37/32165 |
| 9,789,341 B2 | 10/2017 | Abbasi |
| 10,367,508 B1 * | 7/2019 | Miller .................. H01J 35/025 |
| 2006/0255285 A1 * | 11/2006 | Jongen ..................... H05H 7/10 250/396 ML |
| 2009/0218520 A1 | 9/2009 | Nutt |
| 2011/0089335 A1 | 4/2011 | Colard |
| 2011/0266642 A1 * | 11/2011 | Viala ...................... C23C 14/46 257/E29.323 |

(Continued)

FOREIGN PATENT DOCUMENTS

| CN | 107564791 A | 1/2018 |
| CN | 110012585 A | 7/2019 |

(Continued)

OTHER PUBLICATIONS

International Search Report and Written Opinion for Application No. PCT/US2022/048318, mailed Mar. 2, 2023, 9 pages.
Paul 1966, "Variable Energy Extraction from Negative Ion Cyclotrons", Proc. Int. Conf. Isochronous Cyclotrons, p. 74-83.
Burgerjon 1985, "H-Cyclotrons for Radioisotope Production", Nucl. Inst. B10, p. 951-956.

(Continued)

*Primary Examiner* — Tung X Le
(74) *Attorney, Agent, or Firm* — KDW Firm PLLC (57) ABSTRACT

An apparatus may include a cyclotron to receive an ion beam as an incident ion beam at an initial energy, and output the ion beam as an accelerated ion beam at an accelerated ion energy. The apparatus may further include an RF source to output an RF power signal to the cyclotron chamber, the RF power source comprising a variable power amplifier, and a movable stripper, translatable to intercept the ion beam within the cyclotron at a continuum of different positions.

17 Claims, 6 Drawing Sheets

(56) References Cited

U.S. PATENT DOCUMENTS

| | | | |
|---|---|---|---|
| 2013/0169194 A1 | 7/2013 | Larsson | |
| 2014/0097769 A1 | 4/2014 | Schmor | |
| 2017/0332474 A1* | 11/2017 | Abs | H01F 3/10 |
| 2018/0005802 A1* | 1/2018 | Chen | H01J 37/32174 |
| 2020/0029421 A1* | 1/2020 | De Neuter | H05H 7/10 |
| 2021/0007211 A1* | 1/2021 | Takahashi | H03F 3/245 |
| 2021/0345476 A1* | 11/2021 | Smirnov | H05H 3/06 |

FOREIGN PATENT DOCUMENTS

| | | |
|---|---|---|
| CN | 111417251 A | 7/2020 |
| TW | 201143556 A | 12/2011 |
| WO | 2009115135 A1 | 9/2009 |
| WO | 2016191592 A1 | 12/2016 |

OTHER PUBLICATIONS

Milton 1990, "First Beam in a New Compact Intense 30MeV H-Cyclotron for Isotope Production", European Particle Accelerator Conference, p. 1812-1814.

G.G. Gulbekyan, O.N. Borisov, V.I. Kazacha and D. Solivaijs, "Extraction by Stripping of Heavy Ion Beams From AVF Cyclotrons", Cyclotrons and Their Applications 2007, Eighteenth International Conference, p. 308-313.

Schmor 2010, "Review of Cyclotrons used in the Production of Radioisotopes for Biomedical Applications", Proc. Cyclotrons 2010, p. 419-424.

Baumgarten 2013, "Cyclotrons with fast Variable and/or Multiple Energy Extraction", Physical Review Special Topics—Accelerators and Beams 16, (2013), p. 100101-1 to 100101-11.

Lawrence1932, "The Production of High Speed Light Ions Without the Use of High Voltages", Phys. Rev. 40, p. 19-37.

* cited by examiner

CYCLOTRON HAVING CONTINUOUSLY VARIABLE ENERGY OUTPUT

FIELD OF THE DISCLOSURE

The disclosure relates generally to ion implantation apparatus and more particularly to high energy beamline ion implanters.

BACKGROUND OF THE DISCLOSURE

Ion implantation is a process of introducing dopants or impurities into a substrate via bombardment. Ion implantation systems may comprise an ion source and a series of beam-line components. The ion source may comprise a chamber where ions are generated. The beam-line components, may include, for example, a mass analyzer, a collimator, and various components to accelerate or decelerate the ion beam. Much like a series of optical lenses for manipulating a light beam, the beam-line components can filter, focus, and manipulate an ion beam having particular species, shape, energy, and/or other qualities. The ion beam passes through the beam-line components and may be directed toward a substrate mounted on a platen or clamp.

Regarding high energy ion implantation, both tandem accelerators as well as linear accelerators have been implemented in beamline ion implanters to generate high energy ions, such as greater than 1 MeV. Cyclotrons represent another component that presents an attractive approach to generating beams of high energy ions. Among the several types of cyclotrons developed in the high energy physics domain, the isochronous cyclotrons that operate in continuous wave mode are attractive for application in the semiconductor industry. The isochronous cyclotron can be arranged in a very compact manner (<2 m across the main magnet), achieve high energies (5 MeV for protons) and deliver significant average beam current (up to several mA).

One disadvantage of known isochronous cyclotrons is that operation is generally performed at just one output energy: that energy where the ions reach the outer radius of the main magnet and are extracted by a dedicated electrode or magnet. In order to produce variable energy output, several solutions have been developed. These approaches currently either produce (1) discrete energy steps in extracted ion energy (where the magnitude of each step is the kinetic energy gain per turn), or (2) an extracted ion beam having a large spread of energies. These 2 results are acceptable for isotope production or other commercial applications where this technology has found application, while being incompatible with requirements of semiconductor manufacturing, where very stringent beam control and reproducibility are often called for.

With respect to these and other considerations, the present disclosure is provided.

BRIEF SUMMARY

In one embodiment, an apparatus is provided. The apparatus may include a cyclotron to receive an ion beam as an incident ion beam at an initial energy, and to output the ion beam as an accelerated ion beam at an accelerated ion energy. The apparatus may further include an RF source to output an RF power signal to the cyclotron, the RF power source comprising a variable power amplifier, and a movable stripper, translatable to intercept the ion beam within the cyclotron at a continuum of different positions.

In another embodiment, an ion implanter is provided. The ion implanter may include an ion source to generate a negative ion beam, the negative ion beam having an initial ion energy, as well as a cyclotron to receive the negative ion beam as an incident ion beam at an incident ion energy, and output the negative ion beam as a positive ion beam at an accelerated ion energy. The ion implanter may further include an RF power source to output an RF power signal to the cyclotron, the RF power source comprising a variable power amplifier, and a movable stripper, translatable to intercept the ion beam within the cyclotron at a continuum of different positions.

In a further embodiment, a method of generating a high energy ion beam may include generating a negative ion beam having an initial ion energy, and accelerating the negative ion beam in a cyclotron chamber of a cyclotron. The method may include stripping the negative ion beam to generate a positive ion beam, by placing a movable stripper at a predetermined orbit in the cyclotron chamber, and adjusting an amplitude of an RF voltage that is applied to the cyclotron.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

DETAILED DESCRIPTION

An apparatus, system and method in accordance with the present disclosure will now be described more fully hereinafter with reference to the accompanying drawings, where embodiments of the system and method are shown. The system and method may be embodied in many different forms and are not to be construed as being limited to the embodiments set forth herein. Instead, these embodiments are provided so this disclosure will be thorough and complete, and will fully convey the scope of the system and method to those skilled in the art.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

Provided herein are approaches for improved high energy ion implantation systems, based upon a cyclotron architecture. For brevity, an ion implantation system may also be referred to herein as an "ion implanter." Various embodiments provide novel configurations for providing the capability of generating high energy ions, where the final ion energy delivered to a substrate may be 300 keV, 500 keV, 1 MeV, 2 MeV, 5 MeV or greater. In exemplary embodiments, a novel cyclotron assembly may be employed to process an ion beam in a manner that facilitates generation of a monoenergetic ion beam, accelerated to high energy, where the energy of the monoenergetic ion beam is continuously variable.

Figure 1A:
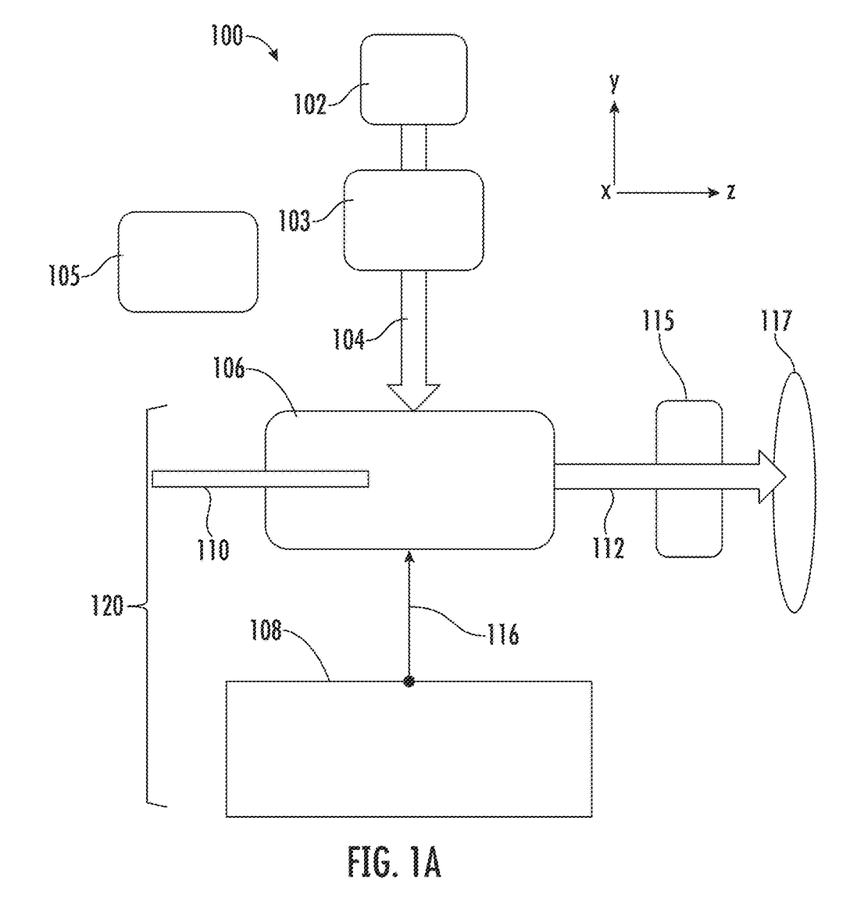
FIG. 1A shows an exemplary ion implantation system, according to embodiments of the disclosure.

Referring now to FIG. 1A, an exemplary ion implanter, shown as ion implantation system 100, is depicted in block form. The ion implantation system 100 may represent a beamline ion implanter, with some elements omitted for clarity of explanation. The ion implantation system 100 may include an ion source 102 to generate an ion beam 104 at a first ion energy. According to various non-limiting embodiments of the disclosure, the ion source 102 is a negative ion source, as known in the art, where various components are omitted. Examples of suitable ion energy for the first ion energy range from 5 keV to 100 keV, while the embodiments are not limited in this context. According to particular non-limiting embodiments, the ion source 102 comprises a negative hydrogen ion source, to produce ion species such as a negative hydrogen ion beam (H⁻). To form a high energy ion beam, the ion implantation system 100 includes various additional components for accelerating the ion beam 104.

The ion implantation system 100 further include an injection assembly 103 (discussed further below), to inject the ion beam 104 into a cyclotron assembly 120, which cyclotron assembly is used to accelerate the ion beam 104, and output a high energy ion beam 112. According to various embodiments, the high energy ion beam 112 may be a positive ion beam. As such, the cyclotron assembly 120 may function to accelerate the ion beam 104 and strip electrons from the negative ions of ion beam 104 so as to generate positive ions. In one example, the ion beam 104 is an incident H⁻ beam, while the high energy ion beam 112 is a H⁺ or proton beam. The high energy ion beam 112 may then be directed through various downstream beam line elements 115 that may steer, shape or scan the beam, depending on the tool architecture, before arriving at substrate 117.

Note that the injection assembly 103 may include an injector (not separately shown) as known in the art. An injector is used to redirect the direction of ion beam 104, from along the y-axis, and into the transverse acceleration plane, meaning the x-z plane.

As shown in FIG. 1A, the cyclotron assembly 120 may include a cyclotron 106 to receive the ion beam 104 as a negative ion beam at an injection energy, referred to herein as an 'incident ion energy.' The cyclotron 106 may act to accelerate, transform, and output the ion beam 104 as a positive ion beam, shown as high energy ion beam 112, at an accelerated ion energy. The cyclotron assembly 120 may also include an RF power source 108, to output an RF power signal 116 to the cyclotron 106. The RF power signal 116 may be applied to dees located within the cyclotron 106, where the operation of dees is described in more detail to follow. In brief, the dees may be curved, opposing electrodes that receive the RF power signal and interoperate with a cyclotron magnet to accelerate the ion beam 104 in spiral orbits (as used herein, the term "orbit" generally refers to a cyclotron orbit, unless otherwise noted), generally according to known cyclotron principles.

Figure 1B:
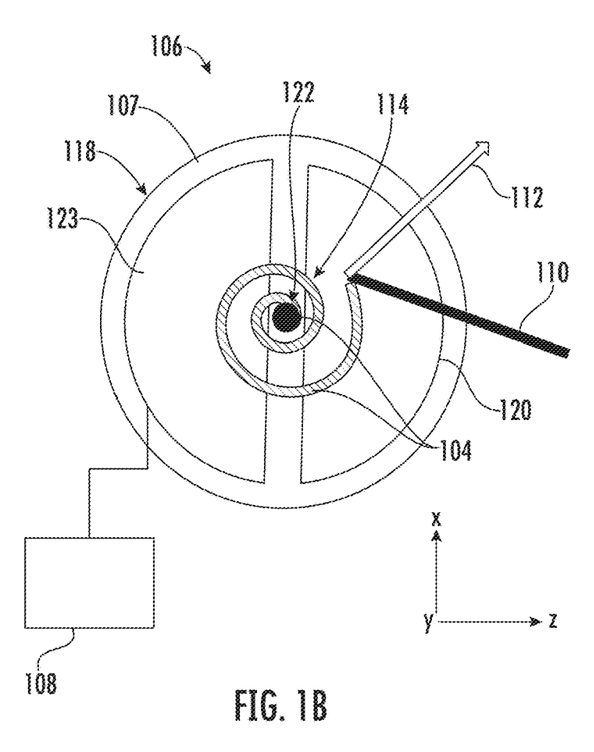
FIG. 1B depicts one variant of a cyclotron, according to embodiments of the disclosure.

According to various embodiments of the disclosure, the RF power source 108 may include a variable power amplifier that allows the amplitude of the voltage of the RF power signal 116 to be varied in a continuous manner. As such, the energy of the accelerated ion beam, meaning the high energy ion beam 112, may be varied in a continuous manner. Referring also to FIG. 1B, which figure depicts one variant of the cyclotron 106, the ion beam 104 is accelerated within the cyclotron 106. The cyclotron path 114 of the ion beam 104 will define a spiral shape, characterized by one or more orbits, having increasing beam radius or beam diameter as shown. As such, at a given angular position, the ion energy between adjacent orbits will increase in step-like fashion, as detailed below. By providing a variable power amplifier, the voltage of the RF power signal 116 may be changed from an unadjusted RF peak voltage to an adjusted RF peak voltage, so that an intermediate energy may be imparted to ion beam 104, where the intermediate energy lies between the ion energy imparted to ion beam 104 at adjacent orbits using the unadjusted RF peak voltage. Said differently, the ability to continuously change the RF peak voltage allows ion energy to be continuously adjustable from a lowest ion energy at the innermost orbit position, to the highest ion energy at an outermost orbit position. In some embodiments, this energy range may span a range of 2 MeV, 4 MeV, 6 MeV, or greater.

As used herein, in accordance with some embodiments, the term 'continuously variable' with respect to ion energy means that between a given energy Emin, and a second energy Emax, using the components, systems, and methods as detailed herein, an ion beam may be extracted from a cyclotron at any desired energy E in between Emin and Emax repeatably to within dE. Note the value of dE can be made arbitrarily small according to the resolution within which the RF Voltage is controlled using control systems with appropriate feedback.

As illustrated in FIG. 1B in particular, the cyclotron 106 includes a cyclotron chamber 118, and a movable stripper 110, translatable within the cyclotron chamber 118 to intercept a plurality of cyclotron orbits, located at a plurality of radial positions with respect to a central axis of the cyclotron 106. The movable stripper 110 may transform a negative ion beam, entering at position 122, into a positive ion beam, exiting to the upper right, where the position of the movable stripper 110 with respect to cyclotron path 114 will determine the energy of the exiting ion beam, meaning high energy ion beam 112. The movable stripper 110 may be formed of a thin conductive sheet or foil, such as a graphite foil. Note that the shape of the dees 123 may vary according to different embodiments, and is shown in FIG. 1B in a simple configuration.

Figure 2:
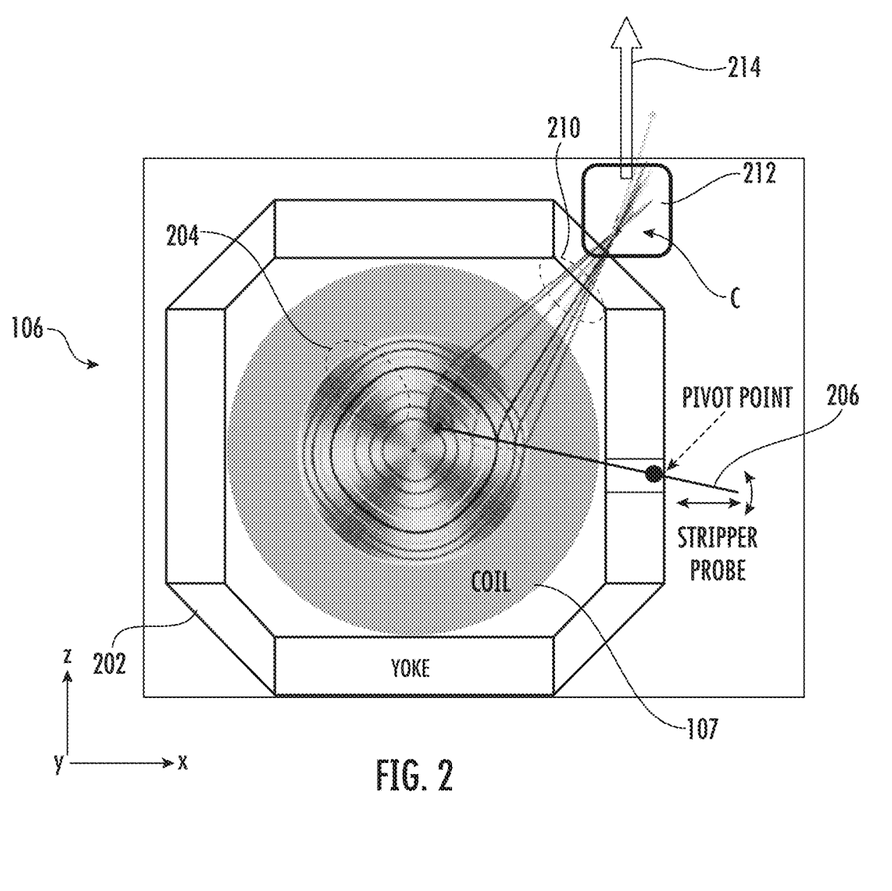
FIG. 2 shows another variant of a cyclotron, according to some embodiments. of the disclosure.

Turning to FIG. 2 there is shown a variant of the cyclotron 106, according to some embodiments. In this example, the cyclotron 106 includes a cyclotron chamber 202, with a plurality of cyclotron orbits, shown as cyclotron orbits 204. A movable stripper 206 is shown, as well as a plurality of ion beam paths for exiting ion beams, shown as ion beam paths 210. The ion beam paths 210 represent the initial trajectories of positive ions that are stripped from different ones of the cyclotron orbits 204. By positioning the movable stripper 206 at different orbits, the energy of the exiting ion beam may be modified in step-like energy increments, where the size of the energy steps is defined by the energy gained by an ion as the ion proceeds for one orbit through the accelerating fields. The exact position of the movable stripper 206 may be adjusted so the ion beam paths 210 all intersect at a given location C, outside the main cyclotron magnet 107. In order to steer the exiting ion beam in a uniform direction, a dipole combination magnet 212 may be provided as shown. The dipole combination magnet 212 may be an electromagnet. The current applied to the dipole combination magnet 212 may accordingly adjustable so as to direct the accelerated ion beam 214 along a common beamline axis (shown as the Z-axis), independently of the ion energy and the initial trajectory of the stripped positive ion beam, represented by the different ones of the ion beam paths 210.

As noted, in order to obtain ion energies that lie between the discrete step-like energy increments, which increments are generated by moving the movable stripper 206 from one cyclotron orbit to another cyclotron orbit, the RF power applied to the dees 123 (see FIG. 1B) may be varied. For example, to impart ion energies for high energy ion beam 112 in the range of approximately 1 MeV to 7 MeV, the energy step between neighboring cyclotron orbits is less than 20%. Accordingly, in some embodiments, the RF power applied between dees 123 may be varied by up to ±20%, which power variation will modify the dee voltages by ±10%, and thus span the energy increment between any two adjacent cyclotron orbits. Careful repositioning of the stripper foil of movable stripper 110 will allow the innermost edge of the movable stripper 206 to be positioned between the cyclotron orbits. Note that the stripper foil may be arranged as in known cyclotrons, at approximately a right angle with respect to a direction of ion beam propagation, and may have a suitable thickness such as in the range of 100 μm, according to some embodiments. Additionally, changing the injected energy of ion beam 104 or the focusing and deflection of the injected beam (ion beam 104) may be needed. Since the perturbations are modest (10%), this result may be simply accomplished by retuning these energy, focusing, and deflection parameters for maximum ion beam transmission.

Unlike known cyclotron arrangements, and in accordance with various embodiments of the disclosure, the movable stripper 110 or movable stripper 206 may be continuously translatable to intercept an ion beam within a cyclotron at a continuum of different positions. In conjunction with changing the amplitude of the voltage of the RF power signal 116 in a continuous manner, this continuous movement of a movable stripper facilitates the ability to conveniently extract an accelerated ion beam from the cyclotron at a continuously variable ion energy, over a wide range of ion energies. Thus, when the amplitude of a given RF voltage signal is adjusted, for a constant magnetic field, the position of spiral orbits of the ion beam within the cyclotron chamber will vary. Since the movable stripper may be translated in a continuous manner over a continuum of positions, the movable stripper position may be adjusted exactly to correspond to the position of the ion beam at a cyclotron orbit corresponding to the ion energy of interest to be extracted from the cyclotron.

Figure 3A:
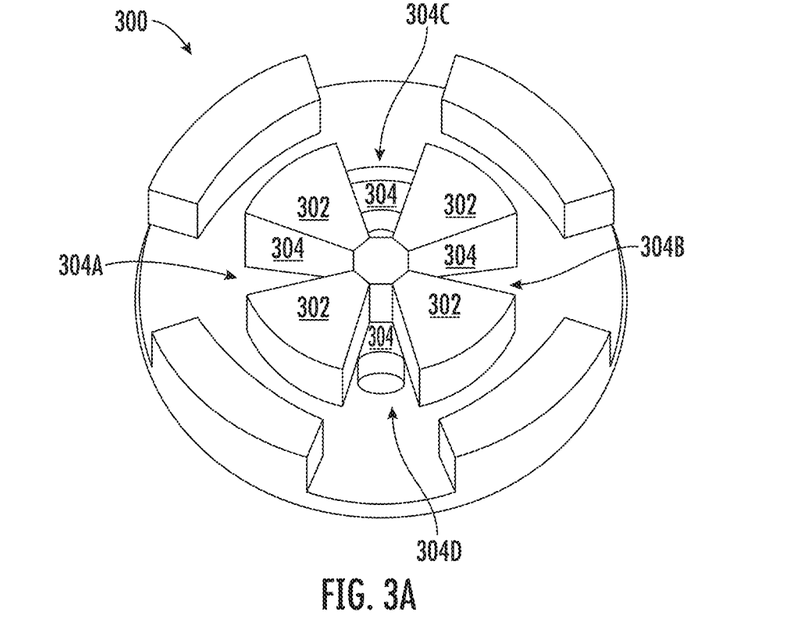
FIG. 3A illustrates a cyclotron magnet, in accordance with embodiments of the disclosure.

As in known cyclotrons, and in accordance with embodiments of the disclosure, the cyclotron 106 or similar cyclotrons includes a cyclotron magnet (not shown in FIGS. 1A-1B), to generate the cyclotron orbits of the ion beam 104, in conjunction with the applied RF voltage. The exact shape of a cyclotron magnet or magnet assembly may vary, while any such magnet may generate a magnetic field extending generally perpendicularly to electric fields generated by the dees. FIG. 3A illustrates a cyclotron magnet 300, in accordance with embodiments of the disclosure. The cyclotron magnet 300 may be suitable for operation in a variant of the cyclotron 106, where the dees are shaped differently than in the variant of FIG. 1B. In this variant, the cyclotron magnet 300 has a circular configuration having four high field regions, shown as high field regions 302, as well as a plurality of low field regions, shown as low field regions 304. The low field regions 304 are alternately disposed between the high field regions 302 along a circular arc. In this embodiment, a pair of energized dees may be located within the 'pockets' defined by the low field regions 304. In particular, a first energized dee may be disposed in a first low field region 304A of the low field regions 304, and a second energized dee may be disposed in a second low field region 304B of the low field regions 304, opposite the first low field region 304A. In accordance with various embodiments of the disclosure, the other two pockets formed by the low field regions 304 may be used for diagnostic components and for accommodating a moveable stripper that is used to extract the ion beam. For example, low field region 304C may be used to accommodate the movable stripper 110, while the low field region 304D is used to accommodate diagnostic components. According to some embodiments, the pockets formed by the first low field region 304A and the second low field region 304B may each occupy an arc portion of approximately 45 degrees, so that the first energized dee and the second energized dee, when placed within these low field regions, may individually occupy a similar arc portion of approximately 45 degrees.

An effect of this geometry is to provide more focusing by alternating field strength using four high field regions in each cyclotron orbit and two energized dees located in the low field "pockets." In some embodiments, the resulting diameter of an ion beam within a cyclotron will be less than or equal to an orbit separation between adjacent cyclotron orbits. In this manner, a monoenergetic ion beam may be extracted from a cyclotron 106 by careful placement of the movable stripper 110, such that just ions from the ion beam at a chosen cyclotron orbit are stripped.

EXAMPLES

Figure 3B:
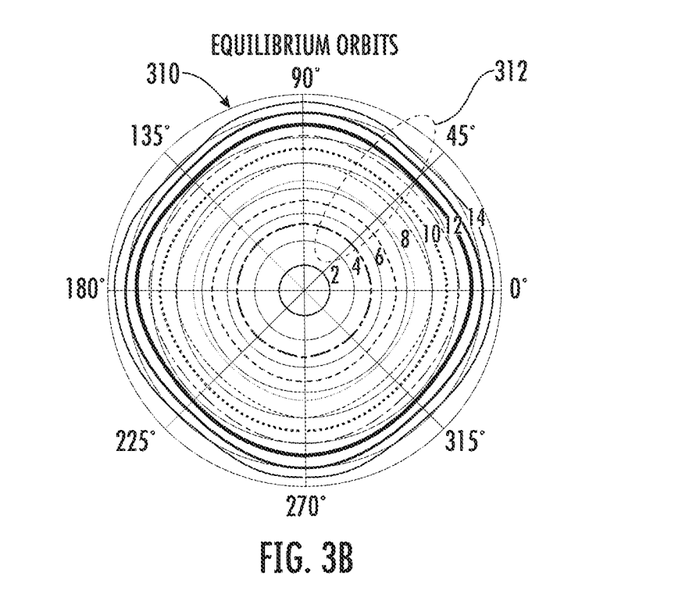
FIG. 3B depicts the shape of the equilibrium orbits generated by the cyclotron magnet of FIG. 3A, in accordance with embodiments of the disclosure.

According to some examples, the incident ion energy (injection energy of an ion beam into a cyclotron) may lie between 10 keV and 100 keV, and the RF power signal applied to the dees in the cyclotron may have a peak voltage of 25 kV to 100 kV. FIG. 3B depicts the orbit geometry in a cyclotron chamber 310 using the magnet configuration as in FIG. 3A. The ion injection energy is 30 keV, while the peak amplitude (Vp) of the applied RF voltage between dees is 55 kV, resulting in energy increments or steps between adjacent orbits of 220 keV. In particular, FIG. 3B depicts the shape of the stable orbits 312, whose average radius is r given by r=mv/qB (where m is ion mass, v is ion velocity, q is unit charge on the ion and B is magnetic field strength; where in SI units m is given in kilograms, v is given in meters/sec, q is given in Coulombs, and B is given in Tesla, and r is given in meters). Note that the detailed shape of the stable orbits shows four regions of tighter radius alternating with four regions of larger radius. Note that the stable orbits are the result of simultaneous radial focusing and axial focusing, and the fact that there is no resonance between the accelerating frequency and the frequency of oscillations of the ions in the focusing field.

Figure 4A:
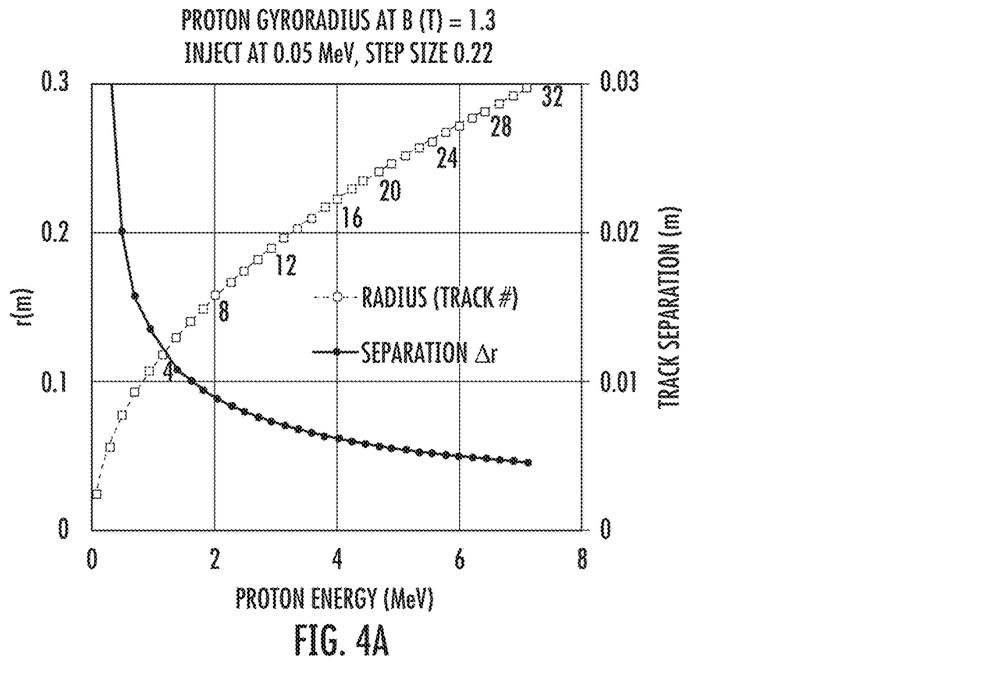
FIG. 4A depicts the average cyclotron orbit radius of successive cyclotron orbits, as well as the radial separation of adjacent cyclotron orbits as a function of ion energy according to one embodiment of the disclosure.

FIG. 4A depicts the calculated average cyclotron orbit radius of successive cyclotron orbits, as well as the radial separation of adjacent cyclotron orbits as a function of ion energy for positive hydrogen ions in a cyclotron magnetic field of 1.3 T. Again, the ion injection energy is set at 50 keV, while the peak amplitude (Vp) of the applied RF voltage between dees is 55 kV, resulting in energy increments between adjacent orbits of 220 keV. Note that even at very high energies, the separation between adjacent orbits remains above approximately 4 mm.

Figure 4B:
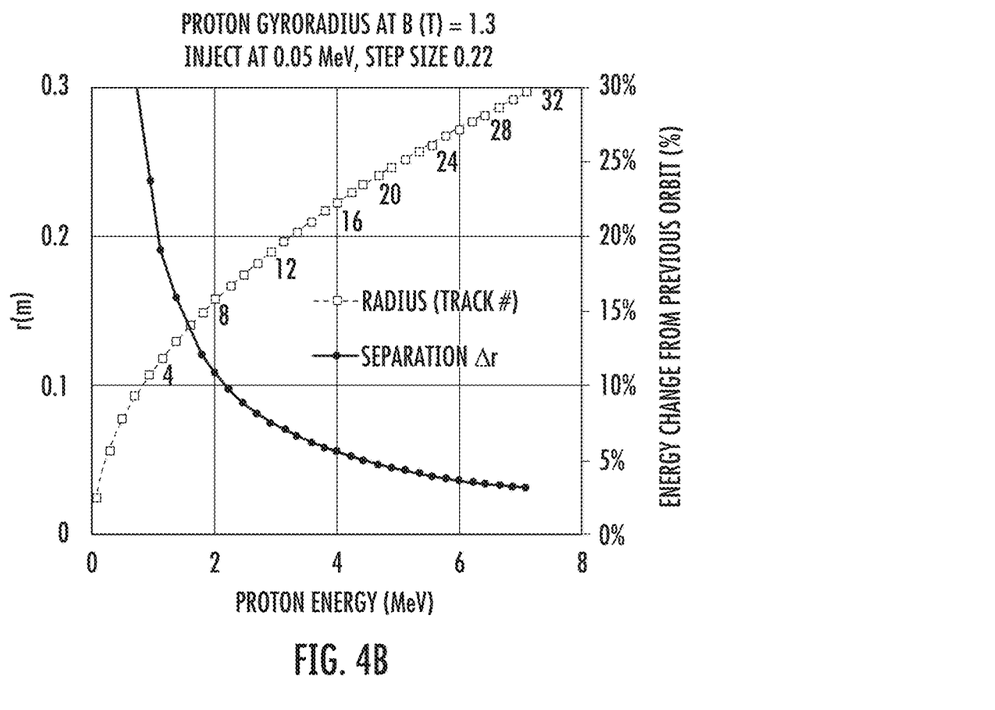
FIG. 4B shows the same average cyclotron radius as a function of ion energy for the conditions of FIG. 4A, as well as the relative energy change between one cyclotron orbit and the next cyclotron orbit.

FIG. 4B shows the same average cyclotron radius as a function of ion energy for the conditions of FIG. 4A, but the right hand axis now shows the relative energy change between one cyclotron orbit and the next cyclotron orbit. Note that for ion energies above 1 MeV, the energy step between adjacent orbits is less than 20% and for ion energies above 2 MeV, the energy step between adjacent orbits is less than 10%.

In accordance with various embodiments of the disclosure, a DC (continuous) ion beam is provided to a cyclotron to allow the cyclotron to accept a fraction of that DC ion beam into the acceleration scheme. The rest of the continuous ion beam will strike internal beamline components and not be accelerated by the cyclotron. In this manner, the cyclotron will acts as its own buncher, generating a bunch of ions.

Note that while traversing a cyclotron path a bunch of ions will inevitably be spread out over some length in an orbit, and furthermore the RF accelerating field applied to the bunch of ions will be spread out over some range, leading to some non-uniform acceleration of the ion bunch during traversal of the gap between powered electrode and ground, or vice versa. To address this issue, according to some embodiments, a composite RF signal may be used to drive the dees of a cyclotron, where the composite RF signal includes a first signal having a first frequency, and a second signal having a second frequency, the second frequency being a harmonic of the first frequency. Because of a symmetry of the requirement in the time domain, odd harmonic frequencies are useful for the second frequency, where the third harmonic frequency will contribute most significantly to generating a composite signal. In other embodiments, adding some of a fifth harmonic as the second signal may also be helpful to generate a suitable composite RF signal, while in theory adding the $7^{th}$ and/or $9^{th}$ harmonic as additional RF signals to a fundamental RF signal may be employed, while having less effect on the composite RF signal.

Figure 5:
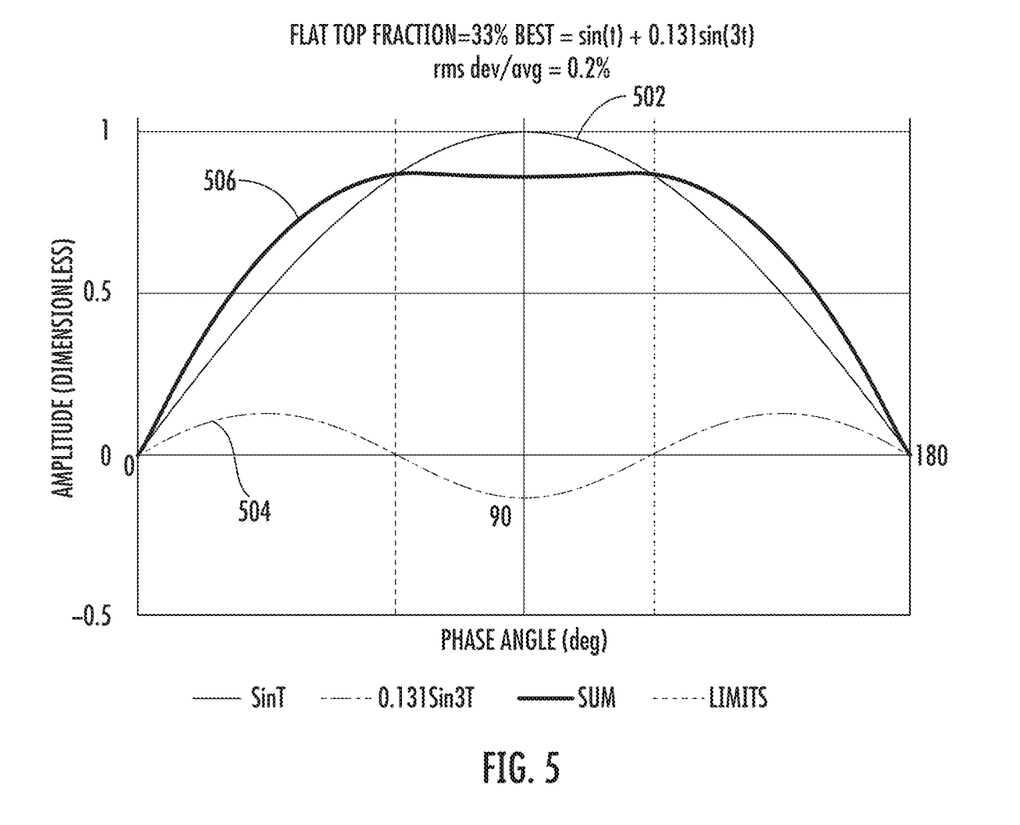
FIG. 5 illustrates the use of a composite RF signal to provide uniform acceleration of ions in a cyclotron according to an embodiment of the disclosure.

FIG. 5 illustrates the use of a composite RF signal to provide uniform acceleration of ions in a cyclotron according to an embodiment of the disclosure. In this example, a first RF signal is generated as represented by curve 502. The curve 502 is a sinusoidal curve, representing an applied voltage signal whose amplitude given by sin(t). A second RF signal is generated as represented by the curve 504. The curve 504 is another sinusoidal curve, representing an applied voltage signal whose amplitude given by 0.131 sin(3t). A second RF signal is generated as represented by the curve 504. The two RF signals are synchronized where each zero point of curve 502 corresponds to a zero point of curve 504. As such, a composite RF signal is produced (a sum of the curve 502 and curve 504), as represented by curve 506. The curve 506 no longer has an ideal sinusoidal shape, and may be characterized as having a flat top region over approximately ⅓ of a cycle, as shown. In particular, the adding of the third harmonic (sin (3t)) with 0.13 of the amplitude of the first harmonic (sin(t)) provides a uniform acceleration for the whole ion bunch to within 0.2%.

The result of the embodiment of FIG. 5 will allow each cyclotron orbit to contain just one energy at any given angular position, and thus be separate from the neighboring cyclotron orbits, provided the phase space distribution and emittance of the ion source injected beam is sufficiently small, and that emittance growth is minimized through appropriate matching of the injected ion source beam to the cyclotron acceptance ellipses in phase space. Using these design parameters, the separation between neighboring cyclotron orbits is more than 5 mm. Note that according to the aforementioned embodiments, the magnetic field design will allow a beam size smaller than the 5 mm orbit separation, so that inserting a movable stripper foil, converting the injected ion from a negative ion to a positive ion will cause the ion orbit to reverse in curvature and emerge from the main magnet. The position of the movable stripper foil may be carefully adjusted so that the positive ion trajectories for different energies all intersect at a point outside the main cyclotron magnet. As noted previously, at this position, a simple dipole combination magnet may be used to steer the ion beam towards the downstream beam line elements that may steer, shape or scan the beam, depending on the tool architecture.

Note that in order to maintain a targeted ion beam size, such as below a 5 mm separation between adjacent orbits, various components of injection assembly 103, such as an inflector (not separately shown) may be tuned as appropriate. Generally, these injector assembly components are to be adjusted (tuned) to focus and steer an ion beam into a cyclotron, such as cyclotron 106, as well as to match, to the extent possible, the phase space distribution's size, shape, and orientation for the injected ion beam, to acceptance ellipses of the cyclotron. As known in the art, these acceptance ellipses are effectively eigen-ellipses that may be obtained by using an appropriate computer model to run the desired extracted beam characteristics backwards from the position of the extraction foil to a position at or near the inflector exit. This procedure will serve to keep the injected ion source phase space ellipse aligned to the shape/orientation of the acceptance ellipses at or near the inflector exit. Otherwise, if the injected ion source phase space ellipse is not well-aligned to the shape/orientation of the acceptance ellipses at or near the inflector exit, then the phase space distribution of the beam at each phase slice in an accelerating beam pulse may grow immensely within the cyclotron. This out-of-alignment condition may result in the beam size in each phase slice of a beam pulse to be larger than a targeted separation in adjacent orbits, such as 5 mm.

In some examples, in order to prevent the phase width of the beam pulse from being larger than the flat region of the curve 506, shown in FIG. 5, components including collimators and scrapers are provided in the cyclotron 106. These components are arranged to trim up in a careful manner a beam pulse of an ion beam while in the $1^{st}$ orbital or 2nd orbital (meaning the innermost orbits) of a cyclotron, such as cyclotron 106. With reference also to FIG. 1A, in some embodiments, a controller 105 or control system may be provided to execute the trimming of the beam pulse, using a feedback loop to ensure that tails of the beam pulse are properly removed, and a "flat" beam pulse is produced with a phase angle extent contained within the flat region of the RF waveform being generated.

As noted previously, to obtain ion energies intermediate between energy "steps" generated in adjacent orbits, the RF power applied to the dees may be varied, leading to some combination of repositioning of a movable stripper, changing ion injection energy, and focusing or deflection of the ion beam. In all these scenarios the movable stripper may nonetheless be positioned so as to intercept a given orbit of the ion beam having monoenergetic ions.

Figure 6:
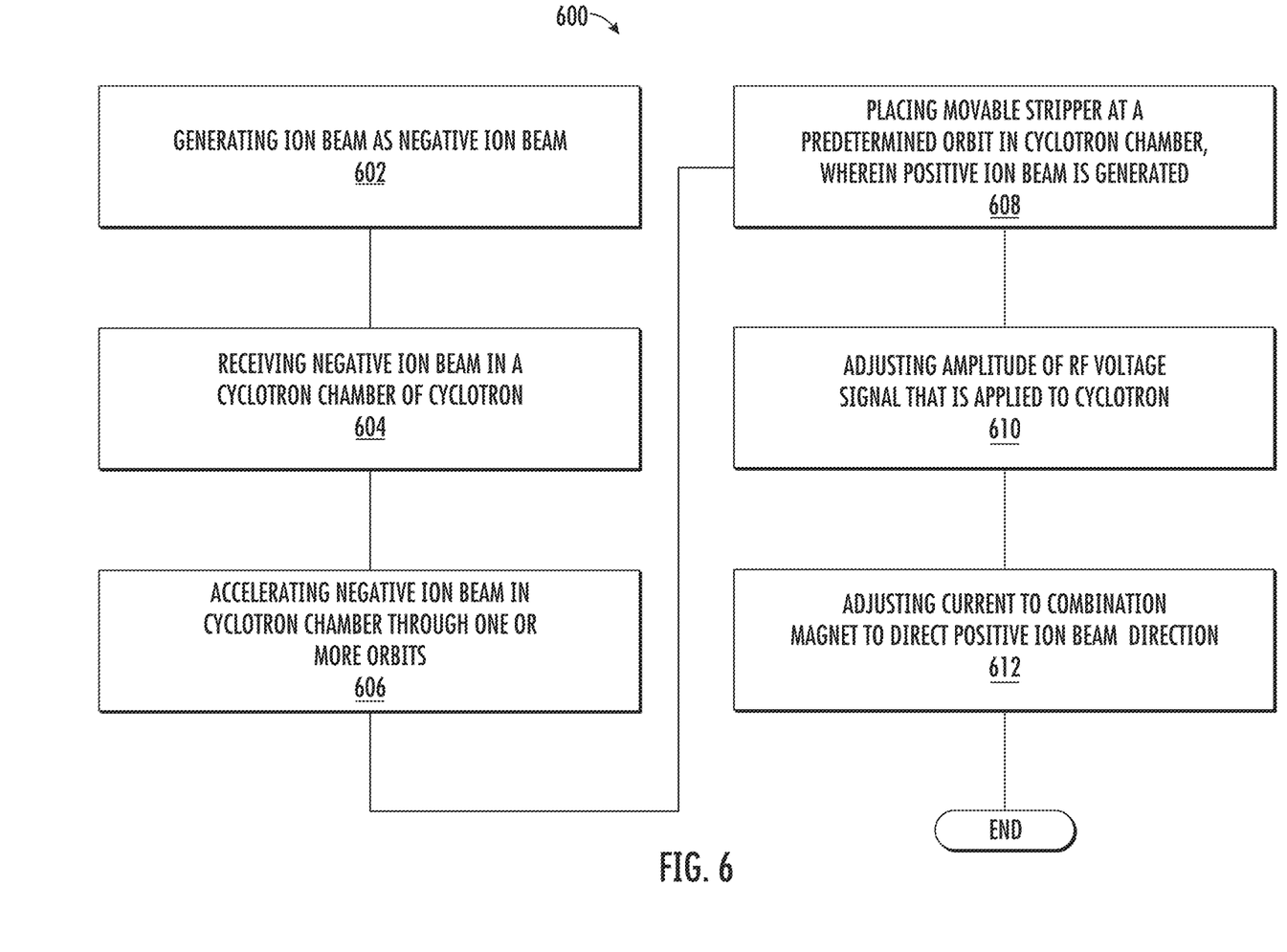
FIG. 6 depicts an exemplary process flow according to some embodiments of the disclosure.

FIG. 6 depicts an exemplary process flow 600 according to some embodiments of the disclosure. At block 602 an ion beam is generated as a negative ion beam, such as by extraction from an ion source. As such, the ion beam may exhibit an ion energy in the range of 10 keV and 100 keV according to some non-limiting embodiments. In some embodiments, the negative ion beam may be a negative hydrogen ion beam.

At block 604, the negative ion beam is received in a cyclotron chamber of a cyclotron. The negative ion beam may be axially injected into the cyclotron chamber along a central axis of the cyclotron chamber according to some embodiments.

At block 606, the negative ion beam is accelerated in the cyclotron chamber through one or more cyclotron orbits. The ion beam may be accelerated by applying an RF power signal to a pair of dees in the cyclotron chamber at a suitable peak voltage, such as a peak voltage of 25 kV to 100 kV, according to some embodiments. In conjunction with the application of a magnetic field of suitable strength, such as 1 T, 1.2 T, 1.4 T, and so forth, the orbits may be separated by a suitable distance from one another, such as at least several millimeters.

At block 608, a movable stripper is placed at a suitable orbit in the cyclotron chamber, to transform the negative ion beam into a positive ion beam and to extract the positive ion beam. The movable stripper may be arranged as a suitable conductive foil.

At block 610, an amplitude of the RF power signal applied to the pair of dees of the cyclotron is adjusted. The operation at block 610 may take place to adjust the energy of the positive ion beam that is extracted from the cyclotron, since the energy between adjacent orbits may increase by increments of several percent to twenty percent or so, depending upon ion energy.

At block 612, the current to the Combination Dipole Magnet is adjusted to steer any of the extracted trajectories onto a common beamline axis.

In view of the foregoing, at least the following advantages are achieved by the embodiments disclosed herein. A first advantage is realized by providing an approach to generate high energy ions having continuously variable energy using a cyclotron. A second advantage is provided by various embodiments, in that the energy of ions extracted from a cyclotron may be monoenergetic, potentially removing the need for beamline components such as energy analyzers. The present embodiments provide further advantages in the context of semiconductor processing. For example, the continuously variable energy for extracted ions according to the present embodiments provides the ability to carefully adjust the implant depth of implanting ions. Moreover, generation of a monoenergetic ion beam, such as a monoenergetic positive ion beam, according to the present embodiments allows precise scanning and collimating of the ion beam.

While certain embodiments of the disclosure have been described herein, the disclosure is not limited thereto, as the disclosure is as broad in scope as the art will allow and the specification may be read likewise. Therefore, the above description are not to be construed as limiting. Those skilled in the art will envision other modifications within the scope and spirit of the claims appended hereto.

The invention claimed is:

1. An apparatus, comprising:
a cyclotron to receive an ion beam as an incident ion beam at an initial energy, and to output the ion beam as an accelerated ion beam at an accelerated ion energy;
an RF source to output an RF power signal to the cyclotron, the RF power source comprising a variable power amplifier; and
a movable stripper, translatable to intercept the ion beam within the cyclotron at a continuum of different positions;
wherein the RF power signal comprises a composite signal that comprises a first signal having a first frequency and a second signal having a second frequency, the second frequency being an odd harmonic of the first frequency.

2. The apparatus of claim 1, wherein the incident ion beam comprises a negative hydrogen ion beam, and wherein the accelerated ion beam comprises a proton beam.

3. The apparatus of claim 1, the cyclotron further comprising:
a cyclotron chamber, wherein the movable stripper is translatable within the cyclotron chamber to intercept a plurality of cyclotron orbits, located at a plurality of radial positions with respect to a central axis of the cyclotron.

4. The apparatus of claim 3, the cyclotron further comprising a cyclotron magnet, interoperative with the RF source to generate the plurality of cyclotron orbits,
wherein the plurality of cyclotron orbits are characterized by an orbit separation, between adjacent cyclotron orbits,
and wherein a beam diameter of the ion beam is less than or equal to a smallest value of the orbit separation for the plurality of cyclotron orbits.

5. The apparatus of claim 1, further comprising a cyclotron magnet, the cyclotron magnet comprising a circular configuration having four high field regions, and a plurality of low field regions, alternately disposed between the high field regions along a circular arc.

6. The apparatus of claim 5, further comprising a first energized dee, disposed in a first low field region of the plurality of low field regions, and a second energized dee, disposed in a second low field region of the plurality of low field regions, opposite the first low field region, the first energized dee and the second energized dee being coupled to receive the RF power signal.

7. The apparatus of claim 6, wherein the first energized dee and the second energized dee are individually arranged to occupy an arc portion of approximately 45 degrees.

8. An ion implanter, comprising:
an ion source to generate a negative ion beam, the negative ion beam having an initial ion energy;
a cyclotron to receive the negative ion beam as an incident ion beam at an incident ion energy, and output the negative ion beam as a positive ion beam at an accelerated ion energy;
an RF power source to output an RF power signal to the cyclotron, the RF power source comprising a variable power amplifier; and
a movable stripper, translatable to intercept the ion beam within the cyclotron at a continuum of different positions;
wherein the RF power signal comprises a composite signal that comprises a first signal having a first frequency and a second signal having a second frequency, the second frequency being an odd harmonic of the first frequency.

9. The ion implanter of claim 8, the cyclotron further comprising:
a cyclotron chamber, wherein the movable stripper is translatable within the cyclotron chamber to intercept a plurality of cyclotron orbits, located at a plurality of radial positions with respect to a central axis of the cyclotron.

10. The ion implanter of claim 9, the cyclotron further comprising a cyclotron magnet, interoperative with the RF source to generate a plurality of cyclotron orbits, characterized by an orbit separation, between adjacent cyclotron orbits, wherein a beam diameter of the ion beam is less than or equal to a smallest value of the orbit separation for the plurality of cyclotron orbits.

11. The ion implanter of claim 8, further comprising a cyclotron magnet, the cyclotron magnet comprising a circular configuration having four high field regions, and a plurality of low field regions, alternately disposed between the high field regions along a circular arc.

12. The ion implanter of claim 11, further comprising a first energized dee, disposed in a first low field region of the plurality of low field regions, and a second energized dee, disposed in a second low field region of the plurality of low field regions, opposite the first low field region, the first energized dee and the second energized dee being coupled to receive the RF power signal.

13. The ion implanter of claim 12, wherein the first energized dee and the second energized dee are individually arranged to occupy an arc portion of approximately 45 degrees.

14. The ion implanter of claim 8, wherein the incident ion energy is between 10 keV and 100 keV, and wherein the RF power signal comprises a peak voltage of 25 kV to 100 kV.

15. A method of generating a high energy ion beam, comprising;
generating a negative ion beam having an initial ion energy;
accelerating the negative ion beam in a cyclotron chamber of a cyclotron;
stripping the negative ion beam to generate a positive ion beam, by placing a movable stripper at a predetermined orbit in the cyclotron chamber; and
adjusting an amplitude of an RF voltage that is applied to the cyclotron;
wherein accelerating the negative ion beam comprises applying an RF power signal to a pair of dees in the cyclotron, wherein the RF power signal comprises a composite signal that comprises a first signal having a first frequency and a second signal having a second frequency, the second frequency being an odd harmonic of the first frequency.

16. The method of claim 15, wherein the initial ion energy is between 10 keV and 100 keV, and wherein the RF power signal is supplied at a peak voltage of 25 kV to 100 kV.

17. The method of claim 15, wherein the movable stripper is translatable to intercept the negative ion beam within the cyclotron at a continuum of different positions,
a monoenergetic positive ion beam is generated at a continuously adjustable ion energy.

* * * * *